United States Patent
Inoue et al.

(10) Patent No.: US 8,592,887 B2
(45) Date of Patent: Nov. 26, 2013

(54) SEMICONDUCTOR STORAGE DEVICE INCLUDING A MEMORY CELL STRUCTURE

(75) Inventors: Daina Inoue, Yokkaichi (JP); Hidenobu Nagashima, Yokkaichi (JP); Akira Yotsumoto, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/332,905

(22) Filed: Dec. 21, 2011

(65) Prior Publication Data

US 2012/0256263 A1 Oct. 11, 2012

(30) Foreign Application Priority Data

Apr. 8, 2011 (JP) .................. 2011-086342

(51) Int. Cl.
*H01L 29/788* (2006.01)

(52) U.S. Cl.
USPC .......................................... 257/316; 257/368

(58) Field of Classification Search
USPC .................. 365/189.04, 189.05, 230.08;
257/E27.103, E29.129, E29.306, 368,
257/316, E21.68, E29.3, 324, E21.409,
257/E29.309; 438/258, 593, 257, 261
See application file for complete search history.

(56) References Cited

U.S. PATENT DOCUMENTS

2008/0246075 A1 * 10/2008 Matsuno ....................... 257/316

FOREIGN PATENT DOCUMENTS

| JP | 2008-192891 | 8/2008 |
|----|-------------|--------|
| JP | 2008-218452 | 9/2008 |
| JP | 2008-251942 | 10/2008 |
| JP | 2009-231300 | 10/2009 |
| JP | 2009-277897 | 11/2009 |

OTHER PUBLICATIONS

Notification of Reason(s) for Refusal issued Feb. 7, 2012 in Patent Application No. 2011-086342 with English Translation.
Notification of Reason(s) for Refusal issued May 8, 2012 in Patent Application No. 2011-086342 with English Translation.

* cited by examiner

*Primary Examiner* — N Drew Richards
*Assistant Examiner* — Christina Sylvia
(74) *Attorney, Agent, or Firm* — Oblon, Spivak, McClelland, Maier & Neustadt, L.L.P.

(57) ABSTRACT

A semiconductor storage device includes an interlayer insulating film provided between select gate electrodes, a first fill material extending along upper portions of memory cell gate electrodes so as to cover air gaps residing between the memory cell gate electrodes, the first fill material extending along sidewalls of the select gate electrodes and sidewalls of the interlayer insulating film so as to define a recess above the first fill material extending along the sidewalls of the select gate electrodes and the sidewalls of the interlayer insulating film, a second fill material filling the recess above the first fill material, and a plurality of contacts formed through the interlayer insulating film, the contacts physically contacting each of device areas formed in a semiconductor substrate.

4 Claims, 14 Drawing Sheets

SEMICONDUCTOR STORAGE DEVICE INCLUDING A MEMORY CELL STRUCTURE

CROSS-REFERENCE TO RELATED APPLICATION(S)

This application is based upon and claims the benefit of priority from Japanese Patent Application No. 2011-086342, filed on, Apr. 8, 2011 the entire contents of which are incorporated herein by reference.

FIELD

Embodiments disclosed herein generally relate to a semiconductor storage device and a method of manufacturing such semiconductor device.

BACKGROUND

Semiconductor storage device such as a NAND flash memory device is facing increasing demand for further microfabrication. Narrower memory cell requires smaller spacing between the neighboring memory cell gate electrodes and thereby increases cross coupling effect of the memory cell gate electrodes to an unignorable level. Cross coupling effect is typically observed through a shift in the threshold voltage of a programmed memory cell transistor by the influence of the subsequent programming of adjacent memory cell transistors. Cross coupling effect expands the range of threshold voltage distribution and thus, may lead to erroneous data read out.

Increased capacitive coupling between adjacent memory cell gate electrodes originating from narrowed memory cell gate electrode gaps increases the magnitude of cross coupling effect. On solution may be forming air gaps between the memory cell gate electrodes to reduce the capacitive coupling between the adjacent memory cell gate electrodes.

Formation of air gaps between the adjacent memory cell gate electrodes also forms air gaps between select gate electrodes and contacts. Such configuration risks the possibility of contact shorting by errors such as etching errors and misalignment. More specifically, when the contact hole is unwantedly connected with the air gap formed in the proximity of the select gate electrode, the contact material may be introduced into the air gap to cause shorting of the adjacent contacts, which in turn leads to yield degradation of the memory being manufactured.

DESCRIPTION

Figure 1:
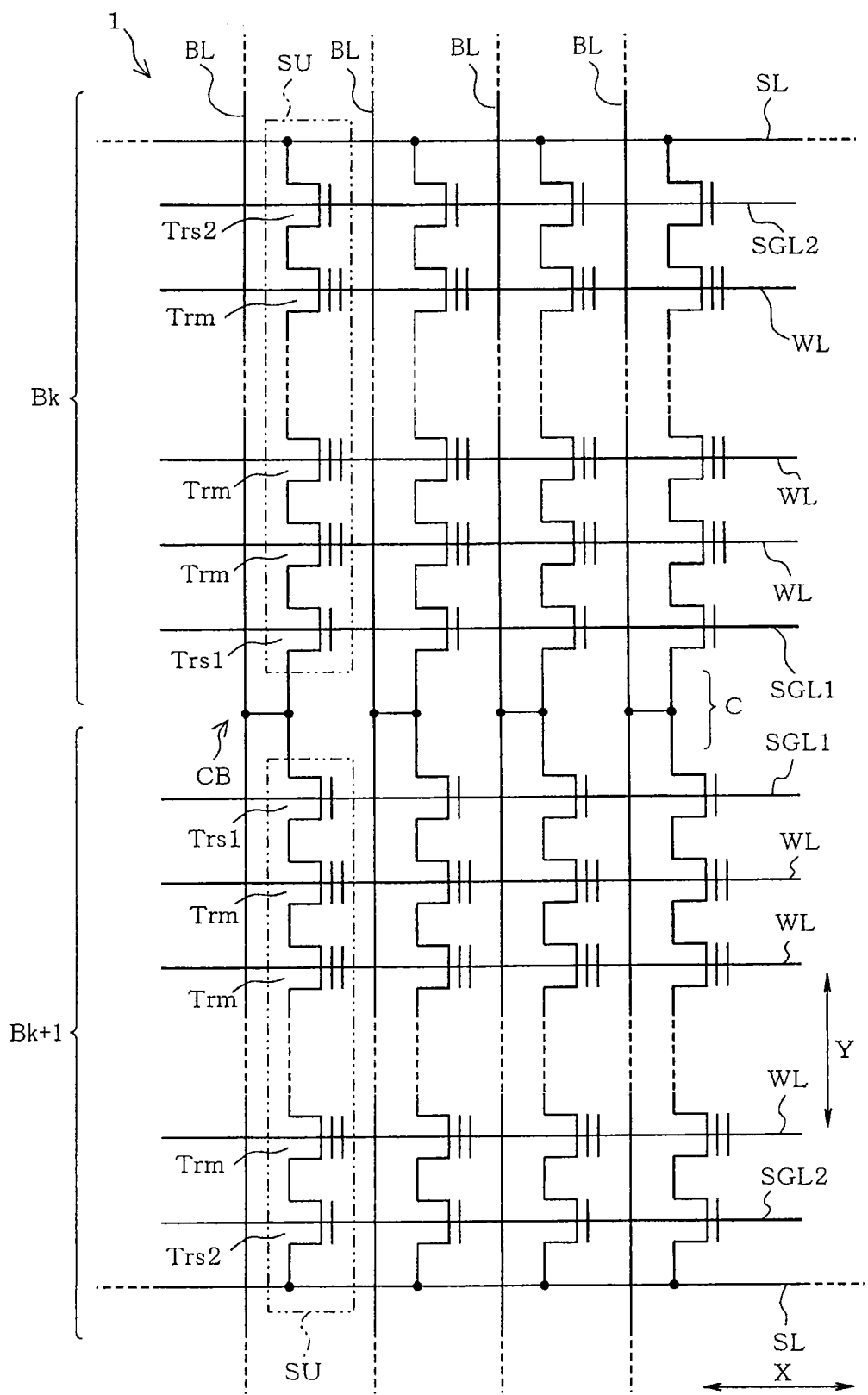
FIG. 1 is a partial equivalent circuit representation of an electrical configuration of a semiconductor storage device according to one embodiment of the present disclosure.

In one embodiment, a semiconductor storage device is disclosed. The semiconductor storage device includes a semiconductor substrate; a plurality of device areas formed in the semiconductor substrate, the device areas being spaced from one another in a first direction and extending along a second direction orthogonal to the first direction; a plurality of select gate electrodes formed in the device area via a gate insulating film, the select gate electrodes being aligned in the second direction; a plurality of memory cell gate electrodes formed in the device area of the semiconductor substrate via the gate insulating film, the memory cell gate electrodes being aligned in the second direction with a first spacing therebetween; an interlayer insulating film formed in a first region between the select gate electrodes, the interlayer insulating film having a sidewall spaced from the select gate electrode by a second spacing greater than the first spacing; a first fill material formed in the first region and a second region between the memory cell gate electrodes, wherein the first fill material extends along upper portions of the memory cell gate electrodes in the second region so as to cover air gaps residing between the memory cell gate electrodes, and wherein the first fill material extends along the sidewalls of the select gate electrodes and the sidewalls of the interlayer insulating film in the first region, thereby defining a recess above the first fill material formed along the sidewalls of the select gate electrodes and the sidewalls of the interlayer insulating film; a second fill material formed above the first fill material and filled in the recess above the first fill material; and a plurality of contacts formed through the interlayer insulating film, the contacts physically contacting each of the device areas.

In one embodiment, a method of manufacturing a semiconductor storage device is disclosed. The method includes forming a gate insulating film, a first gate electrode film, an intergate insulating film, and a second gate electrode film in the listed sequence above a semiconductor substrate; anisotropically etching the second gate electrode film, the intergate insulating film, and the first gate electrode film to define a plurality of memory cell gate electrodes spaced from one another by a first spacing and a plurality of select gate electrodes; forming a sacrificial film in a first region between the select gate electrodes, a second region between the memory cell gate electrodes, and a third region between the select gate electrode and the memory cell gate electrode; anistropically etching the sacrificial film in the first region to form an opening in a central portion thereof, while leaving the sacrificial film in the second region and the third region; forming an interlayer insulating film within the opening; etching an upper surface of the interlayer insulating film so as to be lower than an upper surface of the second gate electrode film and higher than an upper surface of intergate insulating film and so as to separate sidewalls of the interlayer insulating film and sidewalls of the select gate electrode by a first spacing greater than a second spacing between the memory cell gate electrodes; removing the sacrificial film from the second region, the third region, and between the interlayer insulating film and the select gate electrode; forming a first fill material along upper portions of the memory cell gate electrodes so as to cover air gaps residing between the memory cell gate electrodes and along the sidewalls of the select gate electrodes and the sidewalls of the interlayer insulating film, thereby defining a recess above the first fill material formed along the sidewalls of the select gate electrodes and the sidewalls of the interlayer insulating film; filling the recess with a second fill material being formed in a condition having a better gap filling capability than the first fill material; forming a plurality of contact holes through the interlayer insulating film to expose the semiconductor substrate, and forming a contact within each of the contact holes.

Embodiments are described hereinafter with references to the accompanying drawings to provide illustrations of the features of the embodiments. Elements that are identical or similar are represented by identical or similar reference symbols across the figures and are not redescribed. The drawings are not drawn to scale and thus, do not reflect the actual measurements of the features such as the correlation of thickness to planar dimensions and the relative thickness of different layers.

With reference to FIGS. 1 to 14, a description will be given hereinafter on one embodiment of a semiconductor storage device through a NAND flash memory device application.

First, a description is given on the structure of NAND flash memory of the present embodiment.

FIG. 1 is a partial equivalent circuit representation of a memory cell array formed in a memory cell region of NAND flash memory 1. The memory cell array is a collection of units of NAND cells also referred to as NAND cell unit SU or NAND string arranged in rows and columns. NAND cell unit SU comprises a multiplicity of series connected memory cell transistors Trm, such as 64 in number, situated between a couple of select transistors Trs1 and Trs2 that are located at Y-direction ends of NAND cell unit SU. The neighboring memory cell transistors Trm within NAND cell unit SU share their source/drain regions.

The X-direction aligned memory cell transistors Trm shown in FIG. 1 are interconnected by common word line WL, whereas the X-direction aligned select transistors Trs1 are electrically interconnected by common select gate line SGL1 and likewise, the X-direction aligned select transistors Trs2 are electrically interconnected by common select gate line SGL2. Select gate electrode SGD is formed at the intersection of select gate line SGL1 and a later described device region Sa. Similarly, select gate electrode not shown is formed at intersection of select gate line SGL2 and the later described device region Sa.

Figure 2:
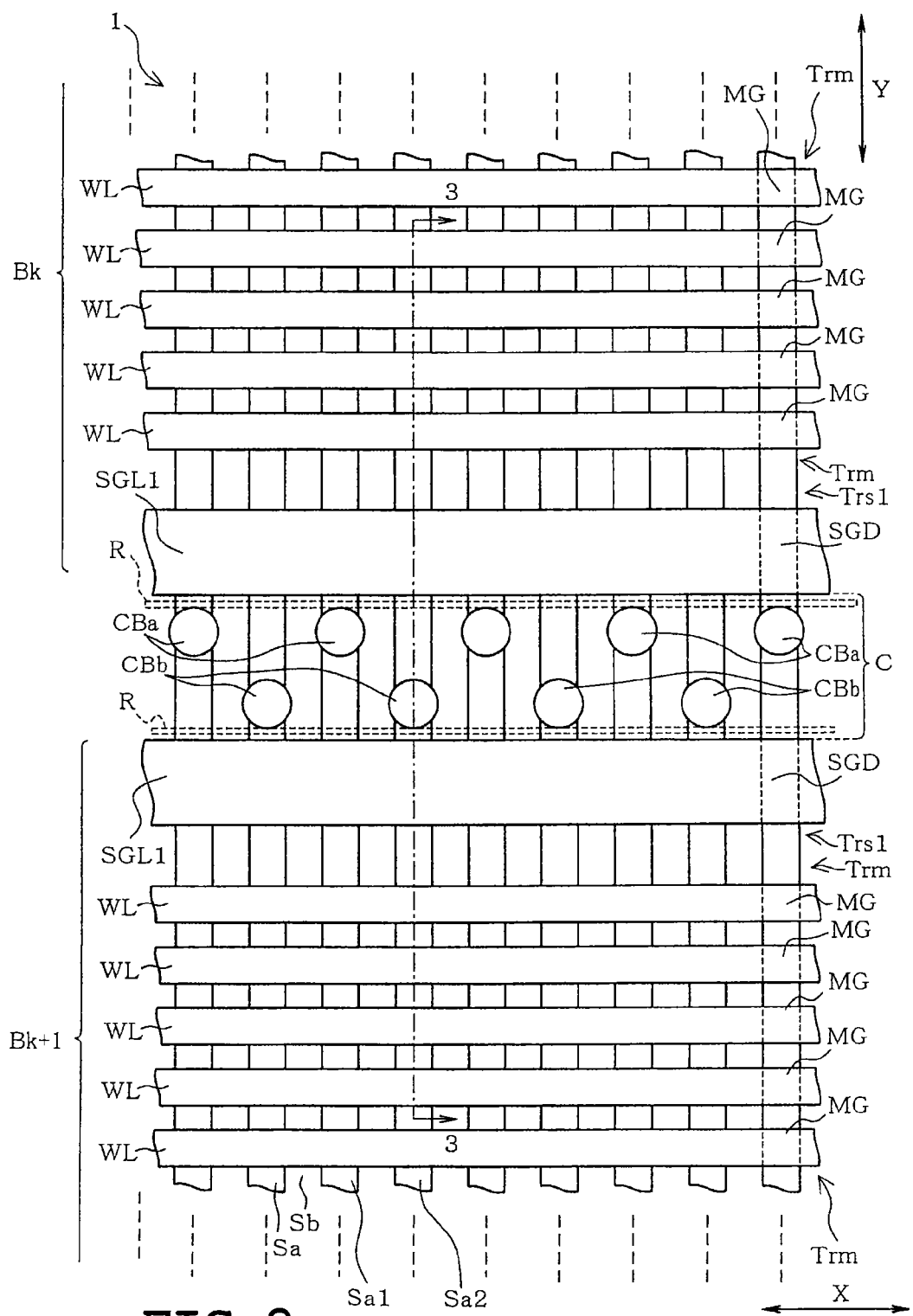
FIG. 2 is a schematic plan view partially illustrating the layout of the semiconductor storage device according to one embodiment.

The drain of each select transistor Trs1 is coupled to bit line BL by way of bit line contact CB represented as CBa and CBb in FIG. 2. Bit line BL extends in the Y direction orthogonal to the X direction shown in FIG. 1. The source of select transistor Trs2 is coupled to source line SL extending in the X-direction.

FIG. 2 provides a planar layout of the memory cell region in part. As shown, multiplicity of isolation regions Sb run in the Y direction as viewed in FIG. 2 of silicon substrate 2, or more generally, semiconductor substrate 2. Isolation regions Sb are separated from one another in the X direction as viewed in FIG. 2 to isolate device areas Sa, running in the Y-direction, by a predetermined space interval in the X direction. The isolation typically employs a shallow trench isolation scheme.

Figure 3:
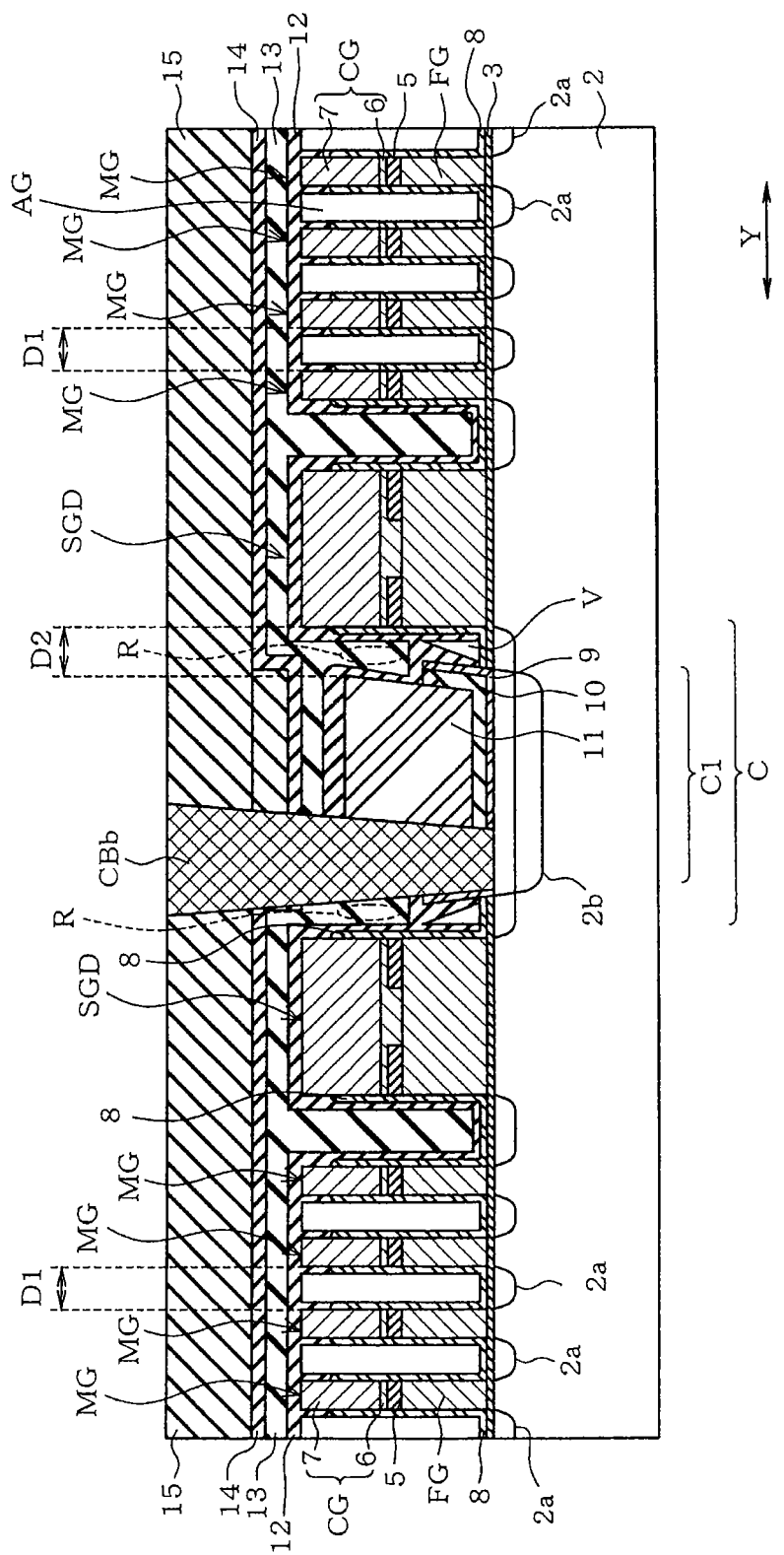
FIG. 3 is a schematic vertical cross-sectional view taken along line 3-3 of FIG. 2.

Multiplicity of word lines WL, spaced from one another in the Y direction by a predetermined spacing, extend in the X direction as viewed in FIG. 2 which is the direction orthogonal to the Y direction in which device area Sa extends. Above device area Sa intersecting with word line WL, memory cell gate electrode MG of memory cell transistor Trm shown in FIG. 3 is formed.

Bit line contacts CBa and CBb are formed alternately one by one in each device area Sa so as to be located between Y-directionally opposing select transistors Trs1.

As can be seen in FIG. 2, bit line contact CBa formed in first device area Sa1, which is exemplified as an odd numbered device area counted in the X direction, is disposed Y-directionally proximal to the select gate line SGL1 or select gate electrode SGD belonging to NAND cell unit SU within block $B_k$. Bit line contact CBb, on the other hand, formed in second device area Sa2, which is exemplified as an even numbered device area counted in the X direction, is disposed Y-directionally proximal to the select gate line SGL2 or select gate electrode SGD belonging to NAND cell unit SU within block $B_{k+1}$.

Thus, bit line contacts CBa and CBb are disposed so as to be Y-directionally shifted from one another in the adjacent device areas Sa to exhibit a zigzag layout as can be seen in FIG. 2. Because of such zigzag layout, spacing between bit line contacts CBa and CBb can be relatively increased. Though not shown, a source line contact is formed in device area Sa located between the two opposing pair of select gate lines SGL2.

FIG. 3 schematically illustrates a vertical cross sectional view taken along line 3-3 of FIG. 2. FIG. 3 shows a Y-directional vertical cross section of the peripheral structures of bit line contact CBb located between an opposing pair of select transistors Trs1 belonging to different NAND cell units SU. Though not shown, Y-directional vertical cross section of the peripheral structures of bit line contact CBa are similar to those illustrated in FIG. 3.

As can be seen in FIG. 3, gate insulating film 3, typically comprising a silicon oxide film, is formed above the semiconductor substrate 2 which may be a p-type silicon substrate. Gate insulating film 3 is formed above regions of semiconductor substrate 2 in which memory cell transistors Trm and select transistors Trs 1 are formed, but not above central region C1 of semiconductor substrate 2 situated beside bit line contacts CBa and CBb.

Memory cell transistor Trm formed above gate insulating film 3 is composed of but not limited to memory cell gate electrode MG and source/drain region 2a. Source/drain region 2a is formed on a surface layer of semiconductor substrate 2 located beside memory cell gate electrode MG. Memory cell gate electrode MG includes floating gate electrode FG, intergate insulating film 5, and control gate electrode CG stacked in the listed sequence above gate insulating film 3. Floating gate electrode FG comprises a polysilicon layer 4 doped with impurities also referred to as a first gate electrode film. Between floating gate electrode FG and control gate electrode CG, intergate insulating film 5 is formed which may also be referred to as an interpoly insulating film, interconductive layer insulating film, and interelectrode insulating film. Intergate insulating film 5 typically takes an ONO structure comprising a stack of oxide/nitride/oxide films, which may be provided with additional bottom and top nitrides to take a NONON structure.

Control gate electrode CG comprises polysilicon layer 6 doped with impurities and silicide layer 7 formed above polysilicon layer 6. Polysilicon layer 6 may also be referred to as a second gate electrode film. Silicide layer 7 may be formed by siliciding the upper portion of polysilicon layer 6 with transition metal such as nickel (Ni), titanium (Ti), cobalt (Co), platinum (Pt), palladium (Pd), tantalum (Ta), and molybdenum (Mo).

Still referring to FIG. 3, select transistor Trs1, located Y-directionally adjacent to memory cell transistors Trm in a given NAND string, is provided with select gate electrode SGD. Select gate electrode SGD is substantially identical in structure to the memory cell gate electrode MG and is configured by stacking polysilicon layer 4, intergate insulating film 5, polysilicon layer 6, and silicide layer 7 in the listed sequence. Select gate electrode SGD differs from memory cell gate electrode MG in that a through hole penetrates the central portion of intergate insulating film 5 to defunctionalize intergate insulating film 5 by providing a structural contact between polysilicon layers 4 and 6. Though not shown, the cross section of select gate transistor Trs2 is also similar in structure to select gate electrode SGD.

Between the adjacent memory cell gate electrodes MG, oxide film 8 serving as a protective film is lined so as to extend from the sidewall of one memory cell gate electrode MG to another. More specifically, sidewall of memory cell gate electrode MG is lined by oxide film 8 which runs down from the mid height of the sidewall of silicide layer 7, along the sidewalls of polysilicon layer 6, intergate insulating film 5, and polysilicon layer 4. Oxide film 8 further runs continuously along the upper surface of gate insulating film 3 above semiconductor substrate 2 situated between the memory cell gate electrodes MG to line the sidewall of the adjacent memory cell gate electrode MG.

Similarly, between the adjacent memory cell gate electrode MG and select gate electrode SGD, oxide film 8 is lined so as to extend from the sidewall of memory cell gate electrode MG to the sidewall of select gate electrode SGD and vice versa. More specifically, sidewall of memory cell gate electrode MG and select gate electrode SGD is lined by oxide film 8 which runs down from the mid height of the sidewall of silicide layer 7, along the sidewalls of polysilicon layer 6, intergate insulating film 5, and polysilicon layer 4. Oxide film 8 further runs continuously along the upper surface of gate insulating film 3 above semiconductor substrate 2 situated between the memory cell gate electrodes MG and select gate electrode SGD.

Between the adjacent select gate electrodes SGD, oxide film 8 is lined along the sidewalls of the adjacent select gate electrodes SGD running continuously toward the Y directional center of bit line contact region C shown as central region C1. As can be seen in FIG. 3, oxide film 8 running continuously from the sidewalls of select gate electrodes SGD extends above gate insulating film 3 overlying semiconductor substrate 2 exclusive of the portion above central region C1 of bit line contact region C. Oxide film 8 serves as a protective film of the sidewalls of select gate electrodes SGD and memory cell gate electrodes MG.

Above central region C1 of bit line contact region C, oxide liner 9 is formed along the upper surface of semiconductor substrate 2. As can be seen in FIG. 3, oxide liner 9 above central portion C1 has extensions that run obliquely upward in slopes or curves above semiconductor substrate 2 so as to lean toward the select gate electrode SGD located on Y-directionally adjacent sides of bit line contact region C. The extensions, however, may be omitted.

Above oxide liner 9, nitride film 10 serving as a contact stopper film is formed along the upper surface of semiconductor substrate 2. As can be seen in FIG. 3, nitride film 10 above central portion C1 also has extensions that run obliquely upward in slopes or curves above semiconductor substrate 2 so as to lean toward the select gate electrode SGD located on Y-directionally adjacent sides of bit line contact region C. The extensions, again, may be omitted.

Above nitride film 10, NSG (Non-doped Silicate Glass) film 11 is formed that serves as an interlayer insulating film. NSG film 11 is formed substantially entirely across the Y direction of central region C1 within bit line contact region C. The upper surface of NSG film 11 is located above the upper surface of intergate insulating film 5 of select gate electrode SGD but below the upper surface of silicide layer 7 so as to be located below the mid height of silicide layer 7. Because oxide liner 9 and nitride film 10 are each provided with upwardly extending extensions at both of their ends, NSG film 11 resides within the width of region C so as to be filled within the extensions.

NSG film 11 is formed so as to increase its cross sectional area with elevation from the upper surface of semiconductor substrate 2. The Y-directional sidewalls of NSG film 11 is negatively tapered so as to extend obliquely upward from the upper surface semiconductor substrate and lean toward select gate electrodes SGD located on both sides of bit line contact region C. Thus, NSG film appears as a reverse trapezoid pointing toward central region C1.

The sidewall of NSG film 11 is distanced from the sidewall of select gate electrode SGD by distance D2, when measured from the upper most edge of the sidewall of NSG film 11, which is greater than distance D1 between the sidewalls of adjacent memory cell gate electrodes MG.

Oxide fill 12 is formed over across select gate electrode SGD and memory cell gate electrodes MG. Oxide fill 12 not only extends along the upper surface of each silicide layer 7 of gate electrodes MG and SGD but also partially along the upper sidewalls of silicide layers 7. Oxide fill 12 covers the upper area of silicide layer 7 left exposed by silicon oxide film 8 which only covers up to the mid height of silicide layer 7.

Between memory cell gate electrodes MG, oxide fill 12 is formed along the upper sidewall of silicide layer 7 of memory cell gate electrode MG so as to partially outline air gap AG provided between memory cell gate electrodes MG. Air gap Ag is provided to reduce capacitive coupling between memory cell gate electrodes MG.

Between gate electrodes MG and SGD, oxide fill 12 is formed so as to cover the upper sidewalls of silicide layers 7 of gate electrodes MG and SGD as well as oxide film 8.

Between select gate electrode SGD and NSG film 11, oxide fill 12 is formed along the upper sidewall of select gate electrode SGD, oxide film 8 located over the sidewall of select gate electrode SGD, and the upper sidewall of NSG film 11. As a result, recess R is formed between select gate electrode SGD and NSG film 11. As can be seen in FIG. 3, recess R is located beside select gate electrode SGD and Y-directionally opposes another recess R located beside select gate electrode SGD over NSG film 11. Beside the lower portion of select gate electrode SGD, void V is provided so as to Y-directionally oppose another void V located beside the lower portion of select gate electrode SGD over NSG film 11. The upper portion of void V is covered by silicon oxide fill 12.

Between oxide fill 12 and the overlying nitride film 14, oxide refill 13 is formed so as to be filled between gate electrodes MG and SGD. Oxide film 8, oxide fill 12, and oxide refill 13 serve as inter gate-electrode insulating film between gate electrodes MG and SGD and fills recess R between select gate electrode SGD and NSG film 11.

Nitride film 14 above oxide refill 13 serves as a stopper film during the anisotropic etching (RIE: Reactive Ion Etching) performed when forming bit line contact CB (CBa and CBb) and as a barrier insulating film that provides a barrier against unwanted substances such as carbon an hydrogen in film formations carried out later in the process flow. Oxide film 15 typically comprising silicon oxide film such as TEOS (Tetra Ethyl Ortho Silicate) is further formed above nitride film 14.

In the central region C1 of bit line contact region C formed in the surface layer of semiconductor substrate 2, a heavily doped impurity diffusion region 2b is formed. Bit line contacts CBa and CBb are formed through oxide film 15, nitride film 14, oxide refill 13, oxide fill 12, NSG film 11, nitride film 10, and oxide liner 9 so as to be placed in physical contact with the upper surface of impurity diffusion region 2b. Bit line contacts CBa and CBb comprise tungsten (W) having a barrier metal coating.

Bit line contact CBb shown in the cross section of FIG. 3 is located relatively closer to the left side select gate electrode SGD and is located to the right side of proximal recess R in which central region C1 is located as viewed in FIG. 3. Though not shown in FIG. 3, bit line contact CBa is formed relatively closer to the right side select gate electrode SGD and to the left to the left side of proximal recess R as viewed in FIG. 2.

Y-directional cross section of insulating films 8, 9, 10, 11, and 12 within bit line contact region C remains substantially the same especially above device areas Sa when taken at any location in the direction normal to the page of FIG. 3, i.e. the X direction. Thus, recess R is formed as a continuous recess R along the X direction as shown in FIG. 2 which is substantially filled with oxide fill 12.

In the present embodiment, because recess R is substantially filled with oxide fill 13, formation of void within recess R can be minimized to prevent formation of contact material of bit line contacts CBa and CBb within the void as much as possible, thereby reducing the possibility of shorting between bit line contacts CBa and between bit line contacts CBb. By suppressing the formation of contact material within recess R, breakdown voltage between select gate electrode SGD and bit line contacts CBa and CBb can be improved.

Formation of oxide film 8 along each of the sidewalls of memory cell gate electrode MG and select gate electrode SGD provide protection for the same. An air gap may or may not be formed between the sidewalls of gate electrodes SGD and MG.

One example of a process flow for manufacturing the above structure will be described with reference to FIG. 4 onwards. The following descriptions will focus on the features of the present embodiment and thus, known steps may be added or removed from the process flow as required. Further the sequence of the process flow may be rearranged if practicable.

As shown in FIG. 3, the Y-directional cross section is substantially symmetrical relative to bit line contact region C and thus, FIGS. 4 to 13 only show one side of the symmetry.

Figure 4:
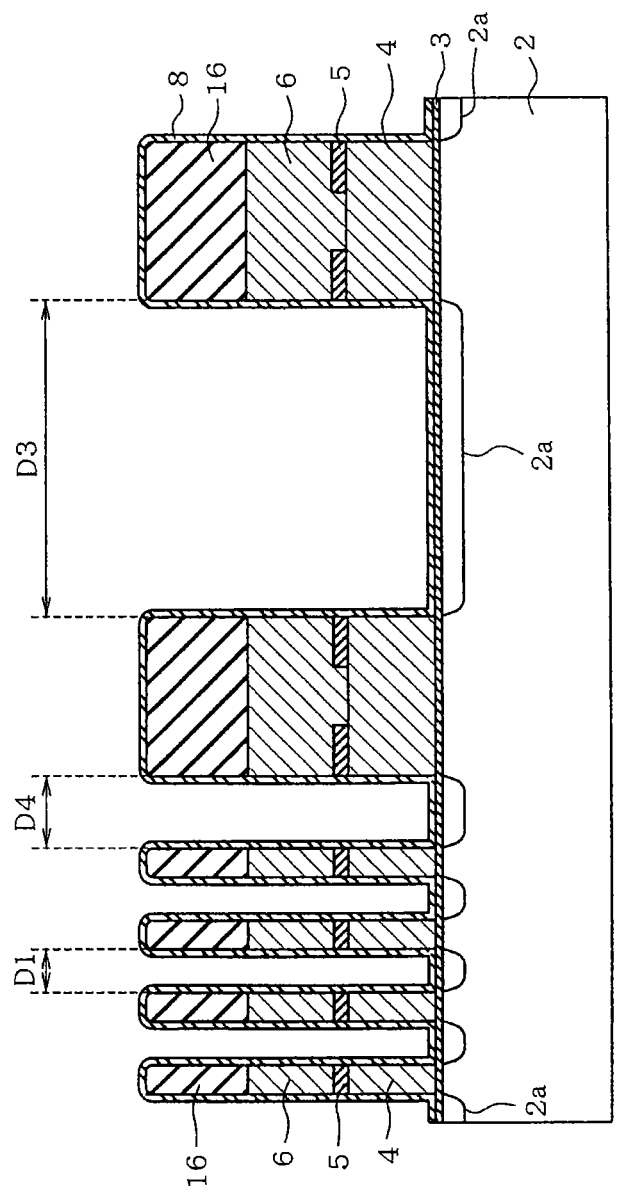
FIGS. 4 to 14 each schematically describes a vertical cross-sectional view of one manufacturing phases of the manufacturing process flow.

As shown in FIG. 4, gate insulating film 3 is formed above semiconductor substrate 2. In the present embodiment, a p-type silicon substrate can be used as the semiconductor substrate. Silicon oxide film can be formed by thermally treating the upper surface of the semiconductor substrate 2. Then, polysilicon layer 4 used for forming floating gate electrode FG is deposited by LPCVD (Low Pressure Chemical Vapor Deposition). Impurity doped to polysilicon layer 4 in the present embodiment is an n-type impurity such phosphorous (P).

Next, though not shown, polysilicon layer 4 and the upper portion of semiconductor substrate 2 are separated by photolithography and etching methods in the direction normal to the page of FIG. 4, i.e. X direction. The gap created by the separation is thereafter filled with an element isolation insulating film not shown to form isolation regions Sb that separate device area Sa into a multiplicity of strips.

Then, above polysilicon layer 4, intergate insulating film 5 typically configured as an ONO stack is formed by LPCVD. Formation of ONO film may be preceded and followed by a radical nitridation to form a NONON stack. Further, the middle nitride layer may be replaced by a layer of aluminum oxide (alumina). Next, above intergate insulating film 5, polysilicon layer 6 serving as the second gate electrode film is formed by CVD. Then, nitride cap 16 serving a cap film is formed above polysilicon layer 6 by CVD.

Next, oxide film not shown is formed that serves as a hard mask in the dry etching, followed by coating and patterning of a photoresist not shown above the hard mask by photolithography. Using the patterned photoresist as a mask, the hard mask is patterned, whereafter the patterned hard mask is used as a mask to anisotropically etch cap nitride cap 16, for instance, by RIE.

Then, by anisotropically etching polysilicon layer 6, intergate insulating film 5, and polysilicon layer 4, the base layers, in other words, the stacked gate structures of gate electrodes MG and SGD are separated. Removal of gate insulating film 3 between the neighboring gate electrodes MG and SGD may be carried out at this stage as well.

As a result, the adjacent gate electrodes MG are spaced approximately by distance D1 and the adjacent select gate electrodes SGD are spaced approximately by distance D3 which is greater than distance D2 as shown in FIG. 4. Since distance D2 is greater than distance D1 as mentioned earlier, D3>D2>D1 represents the relation of the distances The adjacent gate electrodes SGD and MG are spaced approximately by distance D4 which is equal to greater than distance D1 (D1≤D4).

Next, oxide film 8 is formed by ALD (Atomic Layer Deposition). Oxide film 8 is formed above gate insulating film 3, in other words, above semiconductor substrate 2, above the sidewall of polysilicon layer 4, above the sidewall of intergate insulating film 5, above the sidewall of polysilicon layer 6, and above the upper surface and the sidewall of cap nitride cap 16.

Next, using the stacked gate structures of each of gate electrodes MG and SGD as a mask, ions such as phosphorus, in case of an n-type impurity, are implanted in a self-aligned manner into the surface layer of semiconductor substrate 2. Then, impurities implanted into the diffusion layer are activated by thermal treatment to obtain source/drain region 2a. Structures such as those shown in FIG. 4 are obtained by the above described steps.

The above described example only discusses the formation of the diffusion layer in the memory cell region for simplicity. A nonvolatile semiconductor storage device, however, is provided with a peripheral circuit region that drives memory cell through transistor operation, and thus, requires formation of a diffusion region as well. Formation of diffusion regions for the peripheral circuit region and the memory cell region are carried out simultaneously.

Figure 5:
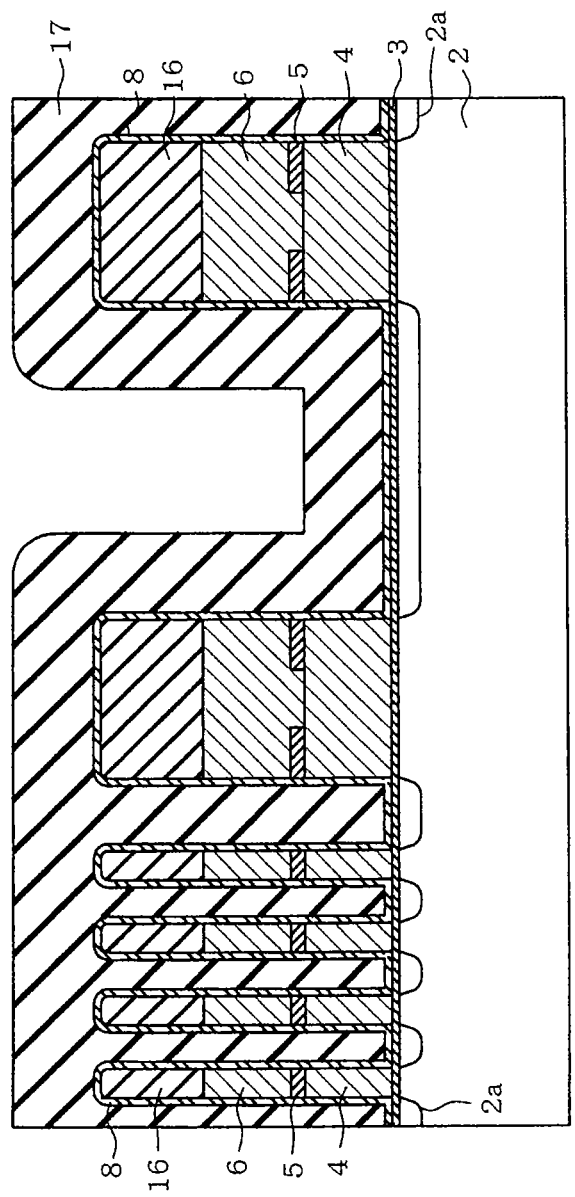

Next, referring to FIG. 5, sacrificial nitride film 17 is formed by ALD between gate electrodes MG and SGD, and between gate electrodes MG. Nitride film 17 and oxide film 8 discussed earlier are preferably formed by ALD, however, LPCVD and plasma CVD may be employed as well.

Figure 6:
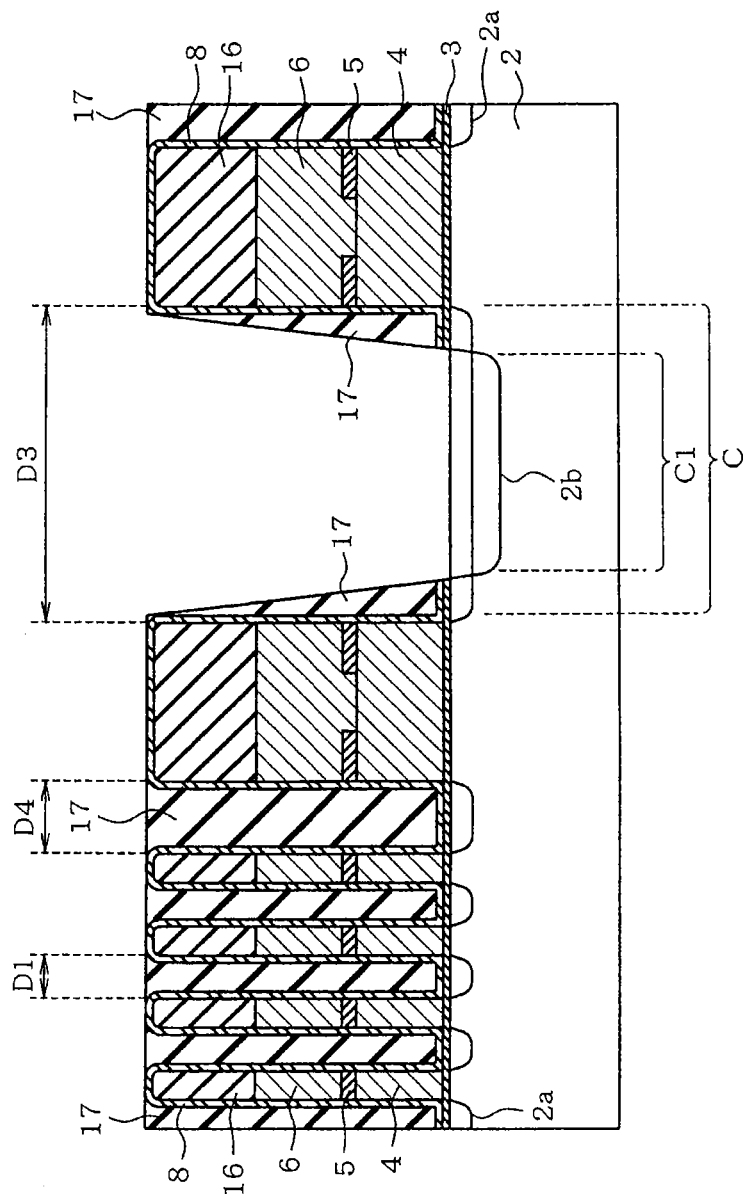

Then, as shown in FIG. 6, sacrificial nitride film 17 is etched anisotropically until the upper surface of oxide film 8 or nitride cap 16 is exposed, thereby forming an opening that exposes the surface of semiconductor substrate 2 in central region C1 of bit line contact region C.

Because spacing D3 between select gate electrodes SGD is greater than spacing D4 between gate electrodes SGD and MG and spacing D1 between memory cell gate electrodes MG, sacrificial nitride film 17 tends to remain on the sidewall of select gate electrode SGD facing central region C1.

As can be seen in FIG. 6, the remainder sacrificial nitride film 17 is sloped or curved so as to lean toward select gate electrodes SGD on both sides of central region C1.

Next, ions such as phosphorous, in case of n-type impurities, are heavily doped by ion implantation into the region exposed between select gate electrodes SGD bound by sacrificial nitride film 17. Thereafter, the doped region is thermally treated to activate the impurities implanted to obtain a heavily doped impurity diffusion region 2b.

Figure 7:
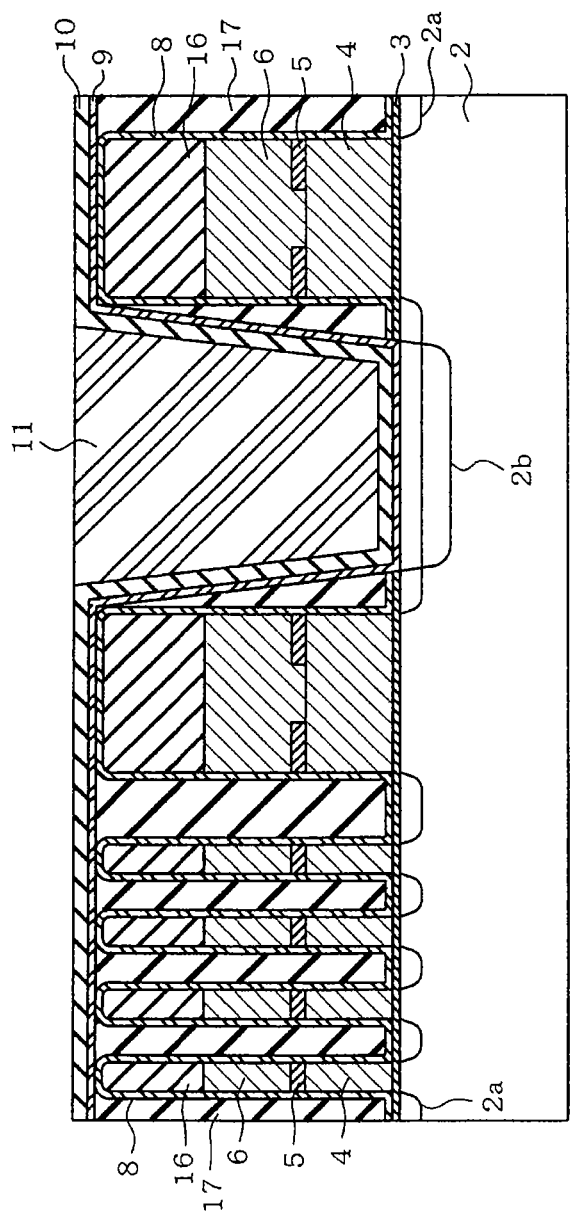

Next, as shown in FIG. 7, oxide liner 9 is blanketed above the underlying structure by CVD. That is, oxide liner 9 is formed above the sloped or curved sacrificial nitride film 17, and above the upper surface of semiconductor substrate 2. Liner film 9 is also lined above oxide film 8, or above nitride cap 16 if it is exposed in the previous RIE, exposed above the upper surface of gate electrodes SGD and MG. Then, above oxide liner 9, nitride stopper 10 serving as a CMP stopper in contact region C is further formed by CVD. Then, NSG film 11 serving as an interlayer insulating film is further formed above nitride stopper 10 so as to fill the gap between the select gate electrodes SGD.

Interlayer insulating film is preferably formed by a material such as NSG film 11 or an oxide film, which has relatively higher wet etch selectivity to sacrificial nitride film 17 and nitride stopper 10. Then, using nitride stopper 10 as the CMP stopper, the upper surface of NSG film 11 is planarized by CMP.

Figure 8:
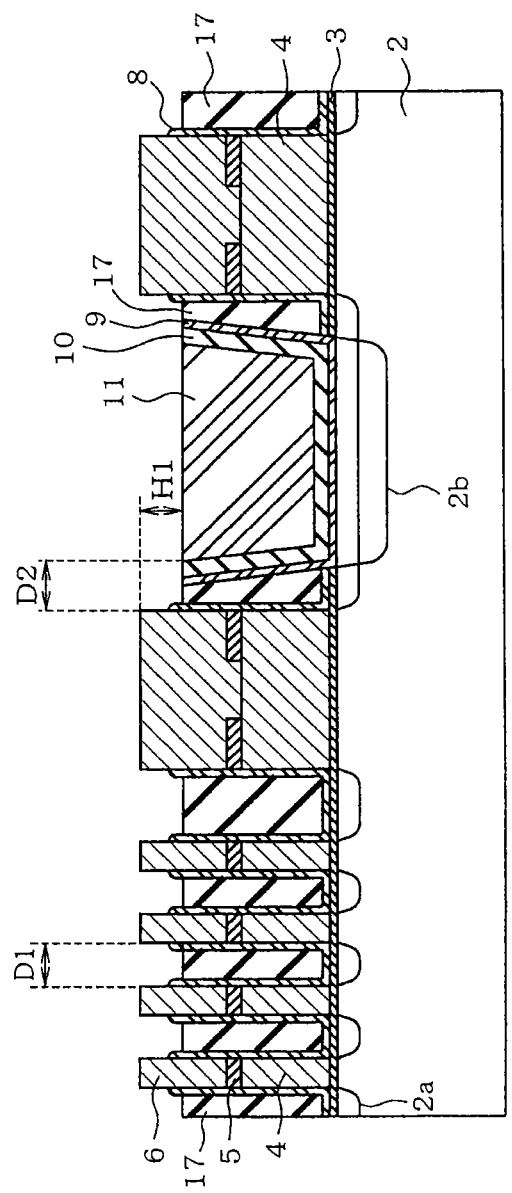

Next, as shown in FIG. 8, nitride cap 16, as well as the upper portions of sacrificial nitride film 17, nitride stopper 10, and oxide liner 9 are etched back by RIE and removed from the top of polysilicon layer 6 to expose the upper surface of polysilicon layer 6. The RIE further etches back NSG 11 such that its upper surface is lowered below the mid height of polysilicon layer 6 but above the upper surface of intergate insulating film 5.

As a result of RIE, the spacing between upper sidewall of NSG film 11 and select gate electrode SGD is increased to spacing D2 which is greater than spacing D1 between memory cell gate electrodes MG as shown in FIG. 8. At this stage, the upper surface of NSG film 11 is lowered than the adjacent polysilicon layer 6 of select gate electrode SGD by height H1 as can be seen in FIG. 8.

Figure 9:
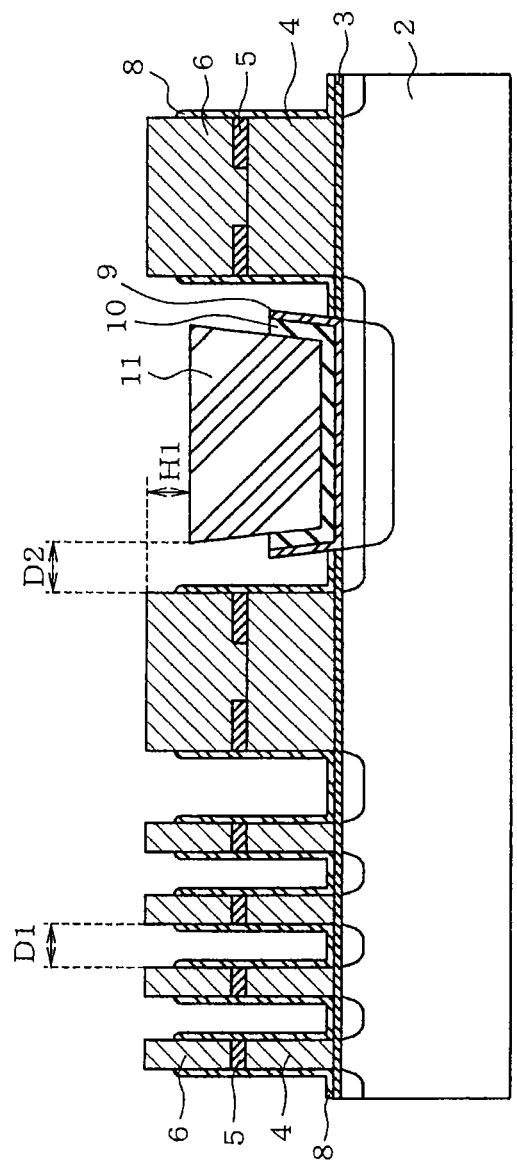

Then, as shown in FIG. 9, sacrificial nitride film 17 and nitride stopper 10 are wet etched with relatively higher etching selectivity to oxide films, thereby almost fully removing sacrificial nitride film 17 between gate electrodes MG, gate electrodes MG and SGD, and gate electrodes SGD. Because the process employs wet etching, nitride stopper 10 located above the sidewall of NSG film 11 is also removed at the same time.

Figure 10:
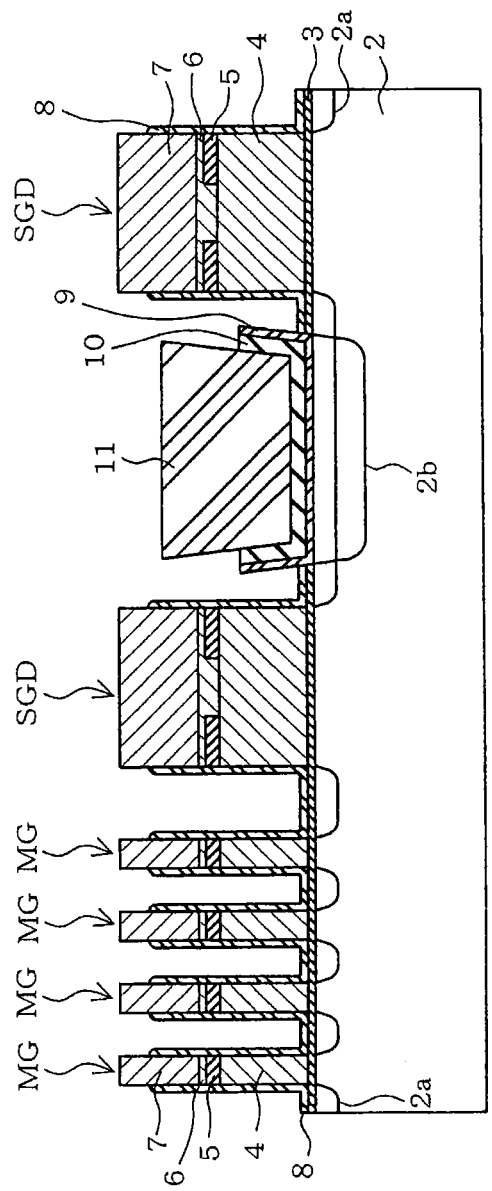

Then, as can be seen in FIG. 10, the aforementioned transition metal is sputtered along the upper surface and sidewall of polysilicon layer 6 and thermally treated by RTA (Rapid Thermal Anneal) to silicide the upper portion or all of polysilicon layer 6 and thereby obtaining silicide layer 7. Silicide layer 7 is stabilized through further RTA. Thereafter, non-reactive metal remaining on the feature is removed by a mixture of sulfuric acid and hydrogen peroxide. Thereafter, silicide layer is stabilized through thermal treatment using RTA method.

Figure 11:
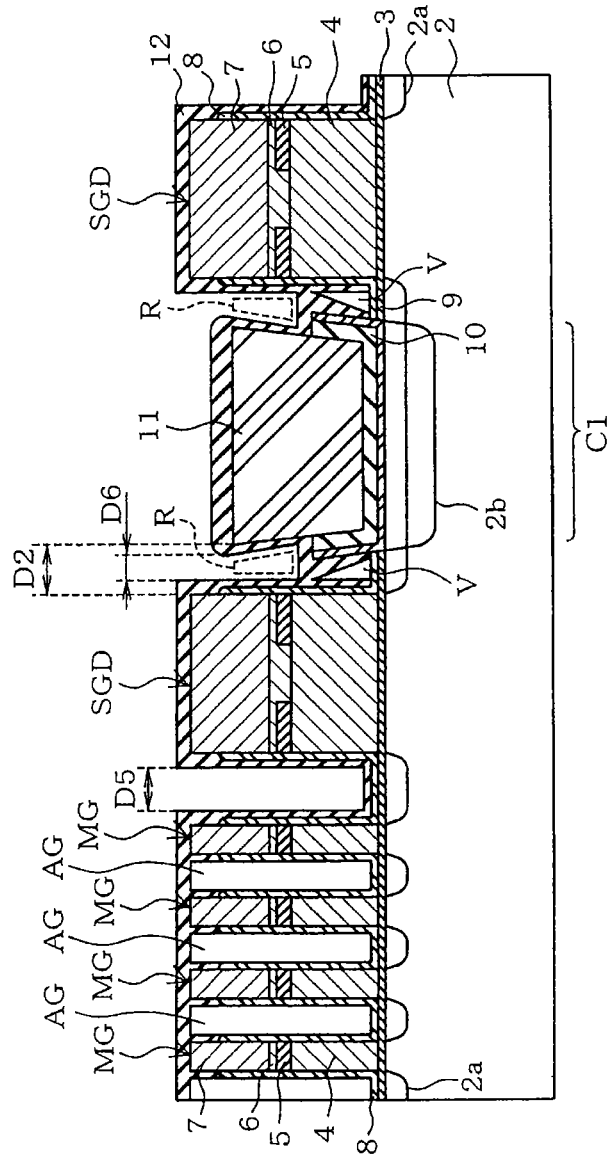

Next, as shown in FIG. 11, oxide fill 12 is deposited by plasma CVD employing a recipe providing relatively poor gap fill capability such that gaps are not filled but covered or enclosed by oxide fill 12 to create air gaps AG between gate electrodes MG. Oxide fill 12 is formed along the upper surface of memory cell gate electrodes MG and select gate electrodes SGD so as to cover or partially outline the upper portion of air gaps AG residing between memory cell gate electrodes MG.

At the same time, between gate electrodes MG and SGD, oxide fill 12 is deposited above the upper sidewalls of gate electrodes MG and SGD and above oxide film 8 located above the sidewalls of gate electrodes MG and SGD. As a result, spacing D4 between gate electrodes MG and SG are reduced to spacing D5 (D5<D4).

Further at the same time, between select gate electrodes SGD, oxide fill 12 is deposited above the upper sidewalls of gate electrodes SGD, above oxide film 8 located above the sidewalls of gate electrodes SGD facing central region C1, above the outer sidewalls and the upper surfaces of oxide liner 9, above the upper surfaces of nitride stopper 10, and above sidewalls and upper surface of NSG film 11. As a result, spacing D2 of the openings between gate electrodes SGD and upper sidewalls of NSG film 11 are reduced to D6 (D6<D2). As a result, recess R is created beside the upper sidewalls of select gate electrodes SGD so as to be embraced by oxide fill 12.

Figure 12:
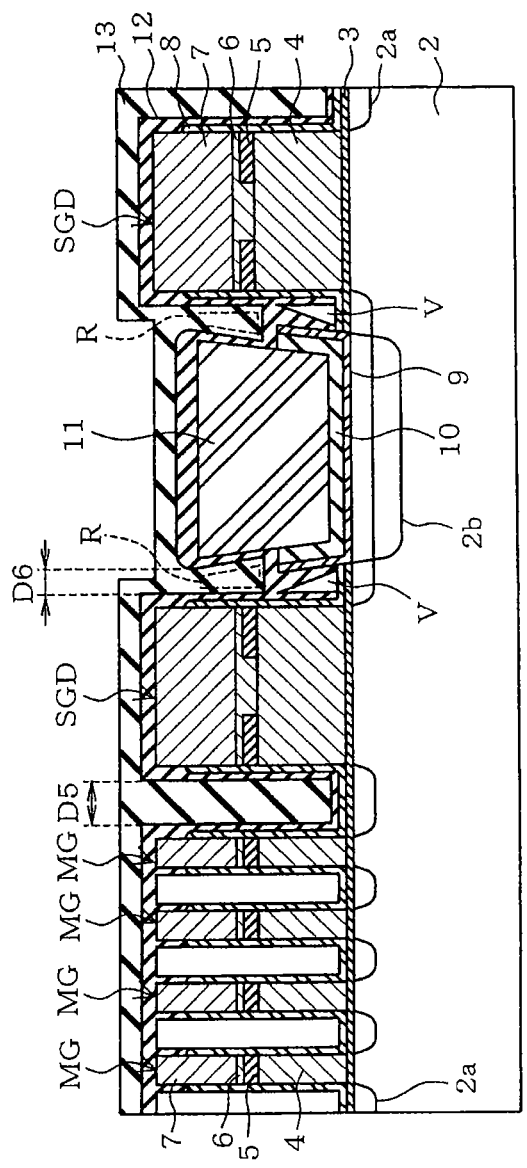

Next, as shown in FIG. 12, oxide refill 13 is formed above oxide fill 12 by ALD or LP-CVD which is carried out at a temperature level being several hundreds of degrees Celsius greater than room temperature. Oxide refill 13 carried out by the above described recipes provide relatively better gap filling capability as compared to oxide fill 12.

Between gate electrodes SGD and MG, oxide refill 13 fills the gaps between oxide fill 12 which are spaced by D5. Though the illustrated features show the gaps being filled completely by oxide refill 13, the gaps may contain voids.

Between gate electrodes SGD, oxide refill 13 fills recess R located in the gap between select gate SGD and the upper sidewalls of NSG film 11 which is spaced by spacing D6. The illustrated features show recess R being filled completely by oxide refill 13 while voids V are observed beside the lower portions of select gate electrodes SGD because of the failure of oxide refill 13 in reaching to that depth. Small voids may be formed in the locations where voids V and recesses R are shown as long as they are small enough to remain harmless to the subsequent contact formation.

Figure 13:
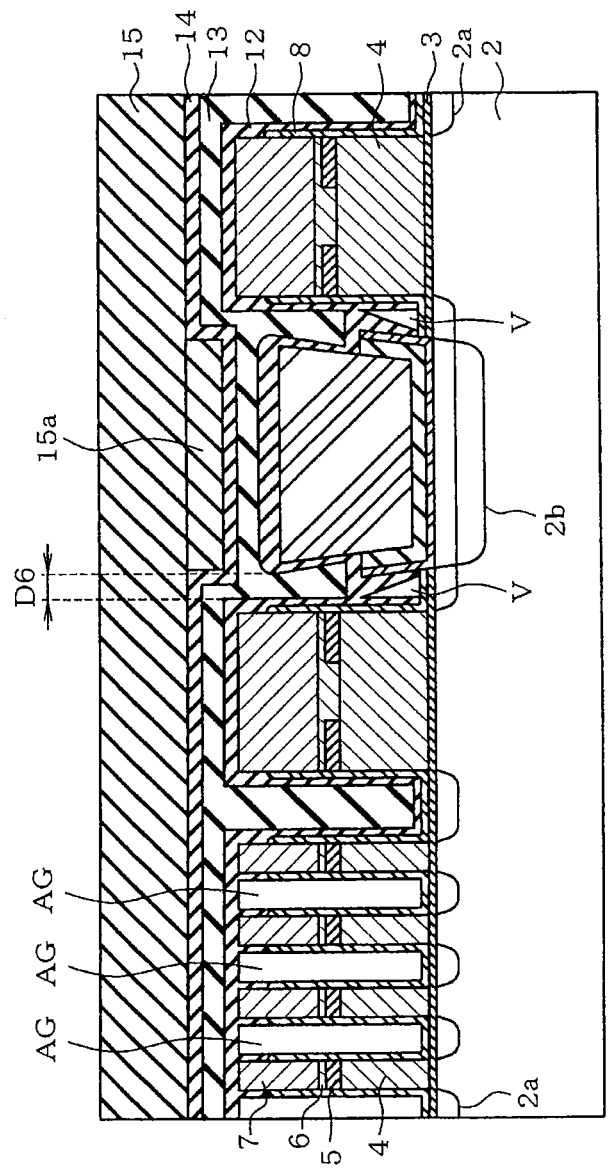

Next, as shown in FIG. 13, nitride film 14 serving as a CMP stopper is formed above oxide refill 13 by LP-CVD. Then, oxide film 15 serving as an upper layer insulating film is overfilled into the recess of nitride film 14 shown in FIG. 14 by LPCVD and is thereafter planarized using nitride film 14 as a CMP stopper to obtain oxide film 15a. Thereafter, oxide film 15 is further deposited as an upper layer insulating film above the planarized surface. Nitride film 14 need not be used as a stopper film, in which case, CMP may be controlled so as to be stopped above silicon nitride film 14.

Figure 14:
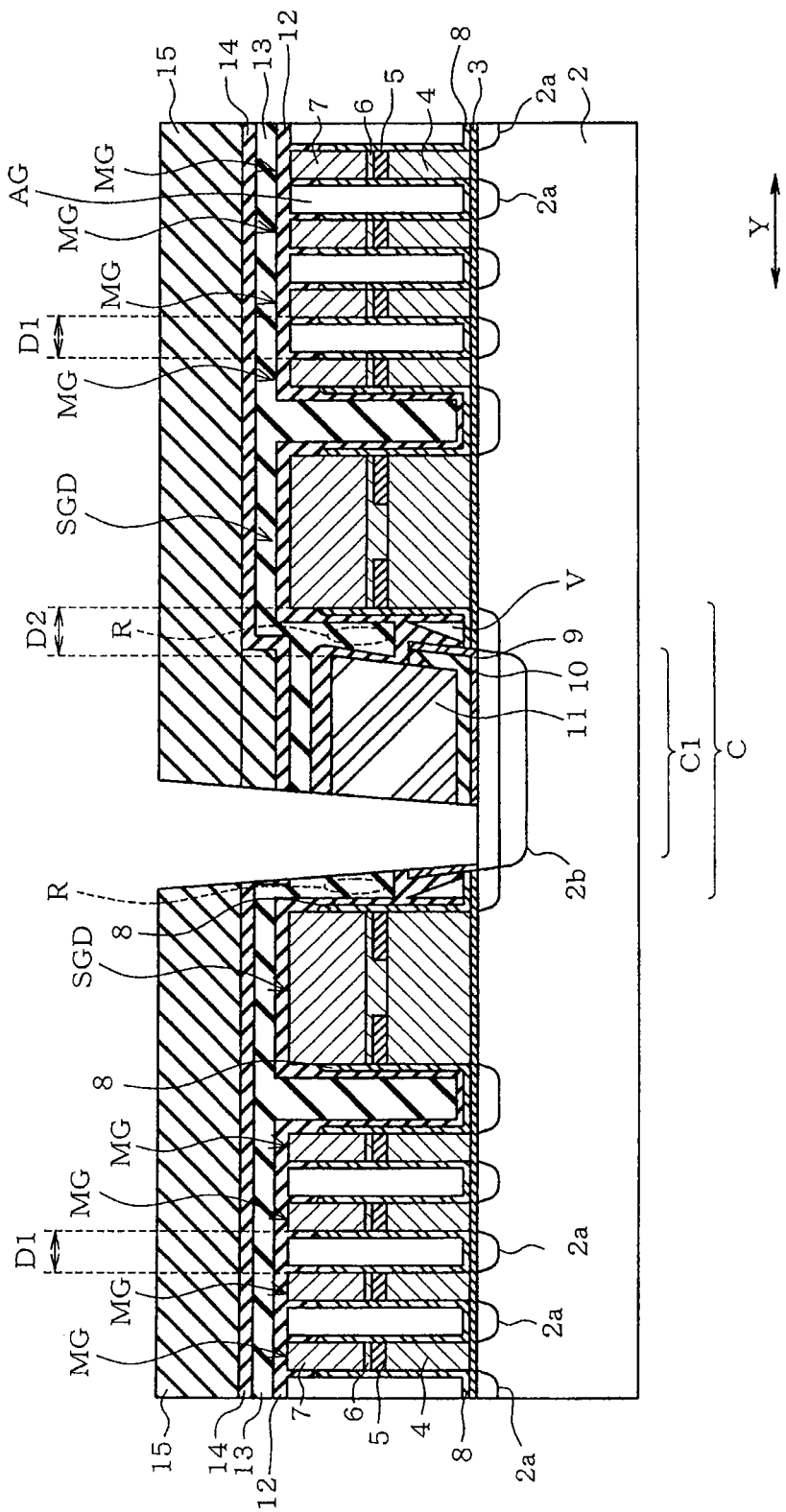

Next, as shown in FIG. 14, a resist not shown is coated and typically patterned by lithography to obtain a resist pattern for forming a contact hole within bit line contact region C. Then, by anisotropic etching such as RIE, a contact hole is formed that penetrates all the way through the laminate to expose the upper surface of semiconductor substrate 2. As shown in FIG. 2, contact holes for every bit line contact CBa and CBb within bit line contact region C is formed simultaneously so as to expose the surface of semiconductor region situated in device area Sa.

Next, referring to FIG. 3, barrier metal not shown is lined along the inner surface of the contact hole, whereafter contact material such as tungsten for forming contacts CBa and CBb are filled in the contact holes by CVD. Again, every contact hole is filled simultaneously to obtain the structure shown in FIG. 2. Because recess R is filled with oxide refill 13 prior to the filing of contact material, the possibility of shorting of bit line contacts CBa neighboring one another in the X direction and shorting of bit line contacts CBb neighboring one another in the X direction can be reduced.

Thereafter, multi layered interconnect structure is formed above bit line contacts CBa and CBb. The process flow thereafter will not be described since they are irrelevant to the features of the present embodiment. The above described process flow is one example for obtaining NAND flash memory 1.

In the above described embodiment, oxide refill 13 fills recess R defined by oxide fill 12 and thus, possibility of voids being formed between bit line contacts CBa/CBb and select gate electrodes SGD can be minimized. Thus, there is very little possibility of bit line contact CBa/CBb material being filled into such voids, thereby suppressing shorting between adjacent bit line contacts CBa and adjacent bit line contacts CBb to improve the yield and the reliability of the memory being manufactured.

Oxide film 8 is formed along the sidewalls of memory cell gate electrode MG and select gate electrode SGD to provide protection for them.

Formation of oxide film 8 along the sidewalls of select gate electrode SGD may narrow the width of the opening formed between gate electrode SGD and NSG film 11 to spacing substantially equal to D6. However, possibility of void formation in recess R can be minimized through filling of oxide film 12 and oxide refill 13 to suppress shorting between bit line contacts CBa and between bit line contacts CBb.

The gaps between gate electrodes MG and SGD need not necessarily be void free.

As can be seen in FIG. 2, bit line contact CBa is formed, for example, in a first device area Sa1 and is formed relatively proximal to select gate electrode SGD within NAND cell unit SU of block $B_k$, whereas bit line contact CBb is formed in a second device area Sa2, adjacent to the first device area Sa1 in the example shown in FIG. 2, and is formed relatively proximal to select gate electrode SGD within NAND cell unit SU of block $B_{k+1}$ of the adjacent to block Bk. Because such configuration repeats alternately in the X direction, a zigzag layout of bit line contacts CBa and CBb is obtained. Because of such zigzag layout, spacing between bit line contacts CBa and CBb can be relatively increased to suppress capacitive coupling. Further, because bit line contacts CBa and CBb are located relatively closer to select gate electrode SGD, the above described contact shorting can be prevented even more effectively.

Oxide fill 12 is formed by plasma CVD under a recipe that provides relatively poor in gap fill capabilities to allow the air gap to be maintained between memory cell gate electrodes MG.

Oxide refill 13 is formed with a film formation recipe that provides better gap filling capability than that of oxide film 12, thus, being able to fill recess R. Oxide refill 13 is preferably formed by ALD or LPCVD.

In the first embodiment, NSG film 11 is employed as the interlayer insulating film and sacrificial nitride film 17 is employed as the sacrificial film to be employed between the select gate electrodes SGD. Because NSG film 11 is not doped with impurities, NSG film 11 can be easily wet etched with relatively higher etching selectivity to sacrificial nitride film 17.

The present embodiment may be modified or expanded as follows.

Bit line contacts CBa and CBb are disposed relatively proximal to either of the opposing select gate electrodes SGD in an alternate arrangement and thus, is in a zigzag layout as can be seen in FIG. 2. Alternatively, a single bit line contact CBa or CBb may be disposed alternately in the Y-directional center of each device area Sa as viewed in FIG. 2

The present embodiment was directed to bit line contact CBa/CBb, but another embodiment may be directed to a source line contact.

Select gate electrode SGD and memory cell gate electrode MG were provided with silicide layer 7 which were obtained by siliciding the upper portion of gate electrodes SGD and MG. Alternatively, polygate may be employed. Further, silicidation may be carried out immediately after formation of polysilicon layer 6 depending upon the type of metal being silicided.

Each of the insulating films represented by reference symbols 8 to 17 are not limited to those exemplified in the above described embodiment but may be replaced by other materials as long as the etching selectivity is maintained. Oxides represented by reference symbols 8, 9, 12, 13, and 15 and nitrides represented by reference symbols 10, 14, 16, and 17 each indicate a silicon-oxide-based oxide films and silicon-nitride-based nitride films, respectively.

NSG film 11 may be replaced by films such as BPSG (Boro Phospho Silicate Glass) and PSG (Phospho Silicate Glass) films.

A dummy transistor may be provided between select gate transistor Trs and memory cell transistor Trm as required.

The above described embodiment was directed to NAND flash memory 1, however other embodiments may be directed to other semiconductor storage devices such as NOR flash memory and EERROM.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device, comprising:

a semiconductor substrate;

a plurality of device areas formed in the semiconductor substrate, the device areas being spaced from one another in a first direction and extending along a second direction orthogonal to the first direction;

first and second select gate electrodes formed in a first device area of the device areas via a gate insulating film, the select gate electrodes being aligned in the second direction so as to form a pair;

a plurality of memory cell gate electrodes formed in the first device area via the gate insulating film, the memory cell gate electrodes being aligned in the second direction with a first spacing and located adjacent to the first select gate electrode so as to be on an opposite side of the second select gate electrode;

an interlayer insulating film formed in a first region between adjacent pairs of select gate electrodes, the interlayer insulating film having a sidewall spaced from one of the select gate electrodes by a second spacing greater than the first spacing;

a first fill material formed in the first region and a second region between the memory cell gate electrodes, wherein the first fill material extends along upper portions of the memory cell gate electrodes in the second region so as to cover air gaps residing between the memory cell gate electrodes, and wherein the first fill material extends along a sidewall of the first select gate electrode and the sidewall of the interlayer insulating film in the first region, thereby defining a recess above the first fill material formed along the sidewall of the first select gate electrode and the sidewall of the interlayer insulating film;

a second fill material formed above the first fill material and extending into a gap located between the sidewall of the first select gate electrode and the sidewall of the interlayer insulating film so as to fill the recess, and between the first select gate electrode and one of the memory cell gate electrodes;

a nitride film formed above the second fill material;

an upper interlayer insulating film formed above the nitride film; and a plurality of contacts formed through the upper interlayer insulating film, the nitride film, and the interlayer insulating film, the contacts physically contacting each of the device areas.

2. The device according to claim 1, further comprising a protective film formed along sidewalls of the memory cell gate electrodes and along the sidewall of the first select gate electrode.

3. The device according claim 1, wherein the device areas further include a second device area located first directionally adjacent to the first device area, the plurality of contacts include a first contact formed in the first device area and a second contact formed in the second device area, and wherein a third select gate electrode is located second directionally adjacent to the first select gate electrode and the fourth select gate electrode is located first directionally adjacent to the second select gate electrode and second directionally adjacent to the third select gate electrode, and wherein the first contact is spaced by a first distance taken along the second direction from the first select gate electrode so as to be relatively proximal to the first select gate electrode and the second contact is spaced by a second distance greater than the first distance taken along the second direction from the third select gate electrode so as to be relatively proximal to the fourth select gate electrode.

4. The device according to claim 1, wherein the sidewall of the interlayer insulating film leans toward the first select gate electrode with elevation from the semiconductor substrate such that cross sectional area thereof increases with elevation from the semiconductor substrate.

* * * * *